United States Patent
Barclay et al.

(10) Patent No.: US 7,306,892 B2
(45) Date of Patent: Dec. 11, 2007

(54) MULTILAYER PHOTORESIST SYSTEM

(75) Inventors: George G. Barclay, Jefferson, MA (US); James F. Cameron, Cambridge, MA (US)

(73) Assignee: Shipley Company, L.L.C., Marlborough, MA (US)

( * ) Notice: Subject to any disclaimer, the term of this patent is extended or adjusted under 35 U.S.C. 154(b) by 0 days.

(21) Appl. No.: 10/718,487

(22) Filed: Nov. 20, 2003

(65) Prior Publication Data

US 2004/0265754 A1    Dec. 30, 2004

Related U.S. Application Data

(60) Provisional application No. 60/427,739, filed on Nov. 20, 2002.

(51) Int. Cl.
*G03F 7/11* (2006.01)
*G03F 7/032* (2006.01)
*G03F 7/30* (2006.01)

(52) U.S. Cl. .................................... 430/271.1; 430/325

(58) Field of Classification Search ............ 430/271.1, 430/270.1, 326, 325
See application file for complete search history.

(56) References Cited

U.S. PATENT DOCUMENTS

| | | | |
|---|---|---|---|
| 3,969,543 A | 7/1976 | Roberts et al. | |
| 4,745,169 A | 5/1988 | Sugiyama et al. | |
| 5,100,503 A | 3/1992 | Allman et al. | |
| 5,240,813 A | 8/1993 | Watanabe et al. | |
| 5,338,818 A | 8/1994 | Brunsvold et al. | |
| 5,525,457 A | 6/1996 | Nemoto et al. | |
| 5,547,808 A | 8/1996 | Watanabe | |
| 5,612,170 A | 3/1997 | Takemura et al. | |
| 5,691,396 A | 11/1997 | Takemura et al. | |
| 5,731,126 A | 3/1998 | Takemura et al. | |
| 5,851,730 A | 12/1998 | Thackeray et al. | |
| 5,882,844 A | 3/1999 | Tsuchiya et al. | |
| 5,886,102 A * | 3/1999 | Sinta et al. | ................. 525/154 |
| 5,935,760 A | 8/1999 | Shao et al. | |
| 5,972,560 A | 10/1999 | Kaneko et al. | |
| 6,033,830 A | 3/2000 | Sinta et al. | |
| 6,042,990 A | 3/2000 | Shao et al. | |
| 6,048,662 A | 4/2000 | Bruhnke et al. | |
| 6,054,254 A | 4/2000 | Sato et al. | |
| 6,080,530 A | 6/2000 | Shao et al. | |
| 6,087,064 A | 7/2000 | Lin et al. | |
| 6,156,479 A | 12/2000 | Meador et al. | |
| 6,165,682 A | 12/2000 | Foster et al. | |
| 6,190,839 B1 | 2/2001 | Pavelchek et al. | |
| 6,210,856 B1 | 4/2001 | Lin et al. | |
| 6,261,743 B1 | 7/2001 | Pavelchek et al. | |
| 6,309,796 B1 | 10/2001 | Nakashima et al. | |
| 6,316,165 B1 | 11/2001 | Pavelchek et al. | |
| 6,323,310 B1 | 11/2001 | Puligadda et al. | |
| 6,342,562 B1 | 1/2002 | Kozawa et al. | |
| 6,368,768 B1 | 4/2002 | Jung et al. | |
| 6,410,209 B1 | 6/2002 | Adams et al. | |
| 6,420,084 B1 | 7/2002 | Angelopoulos et al. | |
| 6,420,088 B1 | 7/2002 | Angelopoulos et al. | |
| 6,444,320 B1 | 9/2002 | Takei et al. | |
| 6,444,408 B1 * | 9/2002 | Brock et al. | ................. 430/322 |
| 6,503,689 B2 | 1/2003 | Zampini et al. | |
| 6,524,708 B2 | 2/2003 | Puligadda et al. | |
| 6,528,235 B2 | 3/2003 | Thackeray et al. | |
| 6,576,681 B2 | 6/2003 | Zampini et al. | |
| 6,599,951 B2 | 7/2003 | Zampini et al. | |
| 6,602,652 B2 | 8/2003 | Adams et al. | |
| 6,653,049 B2 | 11/2003 | Pavelchek et al. | |
| 2002/0022196 A1 | 2/2002 | Pavelchek et al. | |
| 2002/0028408 A1 | 3/2002 | Mao et al. | |
| 2002/0031729 A1 | 3/2002 | Trefonas et al. | |
| 2002/0045125 A1 | 4/2002 | Shao et al. | |
| 2002/0058204 A1 * | 5/2002 | Khojasteh et al. | ....... 430/270.1 |
| 2003/0065164 A1 | 4/2003 | Puligadda et al. | |
| 2003/0129531 A1 | 7/2003 | Oberlander et al. | |
| 2003/0129542 A1 | 7/2003 | Shih et al. | |
| 2003/0180559 A1 | 9/2003 | Wayton et al. | |
| 2004/0253535 A1 * | 12/2004 | Cameron et al. | ........ 430/270.1 |

FOREIGN PATENT DOCUMENTS

| | | |
|---|---|---|
| EP | 0 408 334 A | 1/1991 |
| EP | 1 061 560 | 12/2000 |
| EP | 1 236 745 A | 9/2002 |
| EP | 1 422 566 A | 5/2004 |
| WO | WO 00/54105 A | 9/2000 |
| WO | WO 01/22162 A | 3/2001 |
| WO | WO 02/086624 A1 | 10/2002 |
| WO | WO 02/091083 A1 | 11/2002 |
| WO | WO 03/077029 A | 9/2003 |

* cited by examiner

*Primary Examiner*—Richard L. Schilling
(74) *Attorney, Agent, or Firm*—Peter F. Corless; Darryl P. Frickey; Edwards Angell Palmer & Dodge LLP

(57) ABSTRACT

Multilayer photoresist systems are provided. In particular aspects, the invention relates to underlayer composition for an overcoated photoresist, particularly an overcoated silicon-containing photoresist that is imaged at short exposure wavelengths.

20 Claims, No Drawings

MULTILAYER PHOTORESIST SYSTEM

This application claims the benefit of U.S. Provisional Application(s) No(s). 60/427,739 Nov. 20, 2002.

BACKGROUND

1. Field of the Invention

The present invention relates generally to multilayer photoresist systems. In preferred aspects, the invention relates to underlayer composition for an overcoated photoresist, particularly an overcoated silicon-containing photoresist that is imaged at short wavelengths.

2. Background

Photoresists are photosensitive films used for transfer of images to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photoinduced chemical transformation of the photoresist coating to thereby transfer the pattern of the photomask to the photoresist-coated substrate. Following exposure, the photoresist is developed to provide a relief image that permits selective processing of a substrate.

A photoresist can be either positive-acting or negative-acting. For most negative-acting photoresists, those coating layer portions that are exposed to activating radiation polymerize or crosslink in a reaction between a photoactive compound and polymerizable agents of the photoresist composition. Consequently, the exposed coating portions are rendered less soluble in a developer solution than unexposed portions. For positive-acting photoresists, exposed portions are rendered more soluble in a developer solution while areas not exposed remain comparatively less developer soluble. In general, photoresist compositions include at least a resin binder component and a photoactive agent.

More recently, chemically-amplified type resists have been increasingly employed, particularly for formation of sub-micron images and other high performance applications. Such photoresists may be negative-acting or positive-acting and generally include many crosslinking events (in the case of a negative-acting resist) or deprotection reactions (in the case of a positive-acting resist) per unit of photogenerated acid. In the case of positive chemically-amplified resists, certain cationic photoinitiators have been used to induce cleavage of certain "blocking" groups pendant from a photoresist binder, or cleavage of certain groups comprising a photoresist binder backbone. See, for example, U.S. Pat. Nos. 5,075,199; 4,968,581; 4,810,613; and 4,491,628 and Canadian Patent Application 2,001,384. Upon cleavage of the blocking group through exposure of a coating layer of such a resist, a polar functional group is formed, e.g. carboxyl or imide, which results in different solubility characteristics in exposed and unexposed areas of the resist coating layer. See also R. D. Allen et al. *Proceedings of SPIE*, 2724:334-343 (1996); and P. Trefonas et al. *Proceedings of the 11th International Conference on Photopolymers* (*Soc. of Plastics Engineers*), pp 44-58 (Oct. 6, 1997).

The increasing density of integrated circuits has created a need for higher resolution patterning capabilities. One method of improving resolution involves using a shorter wavelength light during pattern formation. Shorter wavelengths of approximately 200 to 280 nm may be obtained by using a deep UV ("DUV") source such as a mercury/xenon ("Hg/Xe") lamp with appropriate filters. Additionally, KrF (248 nm) or ArF (193 nm) excimer lasers may be used as exposure sources. However, at shorter wavelengths the depth of focus of the exposure tool, which may be an excimer stepper, or step and scan tool, may be adversely affected. The depth of focus ("DOF") is an expression of the range of distances from the image focal plane through which the projected image remains in subjectively acceptable focus. DOF is related to wavelength and lens numerical aperture according to the formula: $DOF \; \alpha \; \lambda/2(NA)^2$ where $\lambda$ is the wavelength of exposing light and NA is the numerical aperture of the lens. Generally, a depth of focus of 1 to 2 µm is required for an adequate lithographic process window, in order to accommodate variations in the thickness or height of the resist film.

In addition to using shorter wavelengths during exposure, it is also desirable to use a thinner layer of resist. However, the major drawback of using a thin layer of resist is that the variation of resist thickness over a diffusion step on a substrate and into an etched pattern increases as the pattern size becomes smaller. This variation means that the dimensions of any pattern being imaged in the resist will vary as the step geometry is traversed. Therefore, in a single layer resist system, the lack of dimensional control on the wafer can create different line widths throughout the resist which reduces the quality of the electronic package.

To improve dimensional control, bilayer (or bilevel or multilevel) resist systems are often utilized. In a typical bilevel system, a bottom resist is first applied to a substrate to planarize wafer topography. The bottom resist is cured and a second thinner imaging top resist is then applied over the bottom resist. The top resist is then soft baked, and patterned (or imaged) using conventional resist exposure and development, followed by etch transfer of the top pattern through the bottom resist using the top resist pattern as an etch mask. Positive resists are commonly used in bilayer applications and are typically based on novolac resins, which are condensation polymers of phenols or substituted phenols and formaldehyde. See generally Sugiyama et al., *Positive Excimer Laser Resists Prepared with Aliphatic Diazoketones, Soc. Plastics Eng., Conference Proceedings*, pages 51-60 (November 1988); and U.S. Pat. Nos. 4,745,169 and 5,338,818.

SUMMARY OF THE INVENTION

We now provide new multilayer photoresist systems where one layer comprises a silicon-containing photoresist composition that is coated over an "underlayer" or bottom layer composition.

Underlayer compositions of the invention preferably contain moieties that will provide enhanced etch-resistance (particularly resistance to a plasma etchant) as well as chromophore moieties that can absorb exposure radiation of the overcoated photoresist to prevent or inhibit undesired reflections of that radiation back into the resist layer.

Typically, the etch-resistant moieties and chromophore moieties will be distinct functional groups. The etch resistant moieties and chromophore moieties suitably may be present on a single (integral) component or present as part of distinct (not covalently liked) components of an underlayer composition. It is generally preferred that the etch resistant and chromophore moieties are present on distinct underlayer composition components.

Preferred etch-resistant moieties include aromatic and alicyclic groups, such as optionally substituted phenyl (including phenol), optionally substituted naphthyl, optionally substituted adamantyl, optionally substituted norbornyl, and the like. Optionally substituted phenolic groups are particularly preferred.

Preferred chromophore moieties may vary with the wavelength of the exposure radiation employed to image an overcoated resist layer. For preferred multilayer photoresist systems of the invention that are imaged at short wavelengths particularly sub-200 nm including 193 nm, anthracene is an especially suitable chromophore group.

That particular suitably of anthracene as a chromophore at 193 nm for bilayer systems of the invention is a surprising result.

Other aromatic groups also may be employed in underlayer compositions as chromophore moieties, particularly multicyclic (fused or separate rings) aromatic groups such as naphthylene, phenathracenyl, fluorneyl, acridinyl, and the like.

Preferred underlayer compositions of the invention comprise one or more resins. The etch-resistant and chromophore groups may be present as part of repeat units of one or more such resins. Particularly preferred underlayer compositions of the invention comprise a first resin that comprises etch-resistant moieties and a second resin (distinct i.e. non-covalently linked with respect to the first resin) that comprises chromophore moieties; i.e., the underlayer composition comprises a blend of distinct resins.

Especially preferred underlayer compositions of the invention comprise a phenolic resin that imparts etch-resistance and a second resin that comprises chromophore moieties such as anthracene or other aromatic groups. References herein to a phenolic resin are inclusive of any resin that comprise phenol groups as a component of a repeat unit, and includes copolymers, terpolymers and other higher order polymers such as acrylate/phenolic copolymers and the like. Typically preferred phenolic resins for use in an underlayer composition include novolak resins and poly (vinylphenol) resins.

Suitable resins that include chromophore moieties include acrylate resins, e.g. resins provided by polymerization of methylanthracene methacrylate or methylanthracene acrylate with other reactive monomers.

Suitably, an underlayer composition will be hardened, crosslinked or otherwise treated to minimize intermixing with the overcoated photoresist layer. References herein to crosslinking of the underlayer composition are inclusive of a reaction where covalent bonds are formed between composition components as well as hardening of the composition where covalent may or may not be formed, but intermixing of the underlayer composition with an overcoated photoresist composition layer is reduced.

Preferred crosslinking (hardening) underlayer compositions will be thermally treated prior to application of an overcoated photoresist layer. An underlayer composition also may be treated with-radiation (e.g. same having wavelength as subsequently used to image overcoated photoresist) to achieve such crosslinking/hardening.

To facilitate curing/crosslinking/hardening under relatively mild conditions (e.g. thermal treatment less than 180° C.), preferably an underlayer composition will contain an acid or acid generator compound such as a thermal acid generator compound and preferably a separate crosslinker component such as an amine-based material, e.g. a melamine or benzoguanamine resin. For such crosslinking compositions, the applied underlayer may be crosslinked prior to application of the overcoated photoimageable composition, e.g. by suitable thermal treatment such as heating at 140° C., 150° C., 160° C., 180° C. or 200° C. for a time sufficient for crosslinking such as 0.5, 1 or 2 minutes. The underlying polymer composition is suitably non-photoimageable, i.e. an image can not be readily patterned into the underlayer composition coating layer, in distinction from an overcoated resist layer.

Suitable underlayer compositions also may be substantially free of a separate crosslinker component and/or an acid or acid generator compound. Such compositions will be preferably thermally treated under relatively vigorous conditions to effect hardening/crosslinking, e.g. at least 180° C., 190° C. or 200° C. for a time sufficient for hardening such as 0.5, 1 or 2 minutes.

Preferred photoresists for application over an underlayer composition of the invention will contain a polymer that comprises Si atoms. Preferred photoresists for use in the multilayer resist systems of the invention may be substantially free of aromatic groups, to facilitate imaging at sub-200 nm wavelengths such as 193 nm or 157 nm. For example, preferred polymers for such sub-200 nm imaging contain less than about 5 mole percent aromatic groups based on total units of the polymer, more preferably less than about 1 or 2 mole percent aromatic groups, still more preferably less than about 0.1, 0.02, 0.04 or 0.08 mole percent aromatic groups based on total units of the polymer. Particularly preferred polymers for 193 nm or 157 nm imaging are completely free of aromatic groups.

Especially preferred photoresists for use in multilayer systems of the invention are chemically-amplified positive resists, i.e. the resists containing a component (e.g. resin) that comprises photoacid-labile groups. Preferred photoacid-labile groups include photoacid-labile esters or acetal groups, such as may be grafted onto resin hydroxy groups. For instance, an ester grafted onto a hydroxy group is a preferred acid-labile group (de-esterification occurs in the presence of photogenerated acid to provide developer-solubilizing carboxy group). Such esters may be provided e.g. by reaction of a haloacetate compound (e.g. tert-butyl chloroacetate) with a hydroxy group. Acetal groups also are preferred photoacid-labile groups; for example a vinyl ether compound may be grafted onto a resin hydroxy moiety to provide a photoacid-labile acetal group. Suitable vinyl ether reagents to provide a photoacid-labile acetal group include compounds having at least one —CH=CH)—O— group such as ethylvinyl ether and the like.

The invention also includes substrates coated with a multilayer resist system as disclosed herein. Preferred substrates include e.g. a microelectronic wafer substrate (e.g. a silicon wafer), an optoelectronic device substrate, and the like.

Methods for forming photoresist relief images and processed microelectronic substrates also are provided. Such methods may suitably comprise applying a coating layer of an underlayer composition of the invention over the substrate (which may have one or more other inorganic or organic layers previously applied thereon); optionally treating the applied underlayer composition coating to crosslink (harden) same e.g. by thermal treatment; applying an Si-photoresist layer over the underlayer composition (where one or more inorganic or organic layer may have been interposed); exposing the applied photoresist coating layer to patterned activating radiation particularly sub-200 nm radiation such as 193 nm or 157 nm radiation; and developing the image-wise exposed photoresist coating layer to provide a photoresist relief image. The areas bared of photoresist by development may then by selectively processed, e.g. with a plasma gas that also will penetrate through the underlayer composition coating.

Other aspects of the invention are disclosed infra.

DETAILED DESCRIPTION OF THE INVENTION

As discussed above, we now provide resist systems that include an organic coating layer composition that is beneath a silicon-containing photoresist layer that is suitably imaged with sub-200 nm radiation such as 193 nm radiation. The underlayer composition comprises etch-resistant and chromophore moieties and may be crosslinked, suitably by thermal treatment prior to application of an overcoated photoresist layer.

Particularly preferred underlayer composition comprises anthracene and phenolic moieties on the same or distinct resins. Surprisingly, we have found that anthracene is an optimal antireflective chromophore for bilayer systems of the invention that are imaged at 193 nm.

Preferably resins of underlayer compositions of the invention will have a weight average molecular weight (Mw) of about 1,000 to about 10,000,000 daltons, more typically about 5,000 to about 1,000,000 daltons, and a number average molecular weight (Mn) of about 500 to about 1,000,000 daltons. Molecular weights (either Mw or Mn) are suitably determined by gel permeation chromatography.

The concentration of a resin component (may be single resin or blend of multiple resins) in an underlayer composition may vary within relatively broad ranges, and in general the resin(s) are employed in a concentration of from about 60 to 100 weight percent of the total dry components (all components except solvent carrier) of the composition.

Underlayer compositions of systems of the invention optionally but preferably may comprise a crosslinker component. A crosslinker may be an integral portion of another composition component (e.g. crosslinker covalently linked to phenolic resin) or may be a distinct composition component. Suitable crosslinkers for use in an underlayer composition include those discussed below for use in negative resist compositions. Preferred crosslinkers for use in underlayer compositions are amine-based materials, particularly amine-based monomers, oligomers or resins such as a melamine resin, benzoguanamine or glycoluril resin. Commercially available Cymel resins (melamine, benzoguanamine and glycoluril resins) are particularly suitable. In addition to being commercially available, such amine-based resins may be prepared e.g. by the reaction of acrylamide or methacrylamide copolymers with formaldehyde in an alcohol-containing solution, or alternatively by the copolymerization of N-alkoxymethyl acrylamide or methacrylamide with other suitable monomers.

A crosslinker component of underlayer compositions of the invention in general is suitably present in an amount of between about 5 and 50 weight percent of total solids (all components except solvent carrier) of the underlayer composition, more typically in an amount of about 7 to 25 weight percent total solids.

Underlayer compositions of the invention also optionally but preferably comprise an acid or acid generator for catalyzing an acid or acid generator compound for catalyzing or promoting curing of an underlayer composition coating layer. Thermal acid generator compounds are preferably employed such as e.g. 2,4,4,6-tetrabromocyclohexadienone, benzoin tosylate, 2-nitrobenzyl tosylate and other alkyl esters of organic sulfonic acids. Compounds that generate a sulfonic acid upon thermal activation are generally preferred. Typically, a thermal acid generator is present in an underlayer composition in a concentration of from about 0.1 to 5 weight percent of total dry components of the composition, more preferably about 2 weight percent of total dry components.

Also, as mentioned, rather than an acid generator compound, an acid may be simply formulated into an underlayer composition. Suitable acids include e.g. strong acids such as sulfonic acids such as toluene sulfonic acid, triflic acid, and mixtures thereof.

Underlayer compositions also may include other optional additives include surface leveling agents, for example, the leveling agent available under the tradename Silwet 7604 from Union Carbide, or the surfactant FC 171 or FC 431 available from the 3M Company.

Underlayer compositions of the invention also may contain one or more photoacid generator compound typically in addition to another acid source such as an acid or thermal acid generator compound. In such use of a photoacid generator compound (PAG), the photoacid generator is not used as an acid source for promoting a crosslinking reaction, and thus preferably the photoacid generator is not substantially activated during crosslinking of the coating composition (in the case of a crosslinking coating composition). In particular, with respect to underlayer compositions that are thermally crosslinked, the coating composition PAG should be substantially stable to the conditions of the crosslinking reaction so that the PAG can be activated and generate acid during subsequent exposure of an overcoated resist layer. Specifically, preferred PAGs do not substantially decompose or otherwise degrade upon exposure of temperatures of from about 140° C. or 150° C. to 190° C. for 5 to 30 or more minutes.

Generally preferred photoacid generators for such use in underlayer compositions include e.g. onium salts such as di(4-tert-butylphenyl)iodonium perfluoroctane sulphonate, halogenated non-ionic photoacid generators such as 1,1-bis [p-chlorophenyl]-2,2,2-trichloroethane, and other photoacid generators disclosed for use in photoresist compositions.

To make a liquid underlayer coating composition, the underlayer composition components are dissolved in a suitable solvent such as, for example, ethyl lactate or one or more of the glycol ethers such as 2-methoxyethyl ether (diglyme), ethylene glycol monomethyl ether, and propylene glycol monomethyl ether; solvents that have both ether and hydroxy moieties such as methoxy butanol, ethoxy butanol, methoxy propanol, and ethoxy propanol; esters such as methyl cellosolve acetate, ethyl cellosolve acetate, propylene glycol monomethyl ether acetate, dipropylene glycol monomethyl ether acetate and other solvents such as dibasic esters, propylene carbonate and gamma-butyro lactone. The concentration of the dry components in the solvent will depend on several factors such as the method of application. In general, the solids content of an underlayer composition varies from about 0.5 to 20 weight percent of the total weight of the underlayer coating composition, preferably the solids content varies from about 2 to 10 weight of the underlayer coating composition.

Photoresists useful in multilayer systems of the invention in general comprise a resin and a photoactive component.

Preferred resist polymers for use in the invention include those that have minimal aromatic content and are employed in photoresist compositions that are imaged with sub-200 nm radiation such as 193 nm or 157 nm radiation.

Generally preferred polymers for use in resists of the invention include those that contain Si atoms as a component of the polymer backbone, e.g. Si—O linkages, rather than a polymer that does not contain Si atoms as part of the backbone or substantial part thereof, but rather as pendant groups. More particularly, preferred polymers include those where at least 5 percent of the total number of atoms in the polymer backbone are Si atoms, or where at least about 10, 15, 20, 25, 30, 35, 40, 45, or 50 percent of the total number of atoms in the polymer backbone are Si atoms.

Preferred polymers for use in resists of the invention include those that are formed from polymerization of a silyl halide or silyl alkoxide, particularly a silyl trihalide or trialkoxy silane such as reagent of the formula R—Si(halide)$_3$ e.g. R—Si(Cl)$_3$. The R moiety suitably may be aromatic (e.g. phenyl or naphthyl) or non-aromatic such as an optionally substituted alkyl or alicyclic groups such as norbornyl, adamantyl or the like. Such R groups may be substituted by a photoacid-labile group e.g. acid-labile ester such as t-butyl ester or acetal group, or an acetal group, or by aqueous base-solubilizing groups such as a fluorinated alcohol, sulfonamide, thiol, or the like.

As discussed above, preferred polymers for use in resists of the invention also contain photoacid-labile groups to provide a chemically-amplified positive resist. Preferred photoacid-labile groups include photoacid-labile ester or acetal groups, such as may be grafted onto —OH groups.

For instance, a haloacetate reagent such as tert-butyl chloroacetate (ClCH$_2$CO$_2$C(CH$_3$)$_3$) may be reacted with a hydroxy moiety such as a phenolic hydroxy. A carbonate reagent also may be reacted with a hydroxy moiety to provide pendant photoacid-labile esters, e.g. di-tert-butyl dicarbonate (O[CO$_2$C(CH$_3$)$_2$]$_2$) may be reacted with polymer hydroxy groups to provide pendent acid-labile ester groups. Reactions of such haloacetate or dicarbonate reagents may be suitably conducted under either acidic or basic conditions such as in the presence of potassium t-butoxide or N,N-dimethylaminopyridine. Basic reaction conditions are generally preferred.

A vinyl ether compound also suitably may be grafted onto a polymer hydroxy moiety to provide a photoacid-labile acetal group, e.g. a compound having at least one —CH═CH)—O— groups such as ethylvinyl ether, t-amylvinyl ether, t-butylvinyl ether, vinylisobutyl vinyl ether, vinylpropyl ether, vinyl-2-ethylhexyl ether, vinyloctadecyl ether, and the like, as well as compounds that have two vinyl groups such as hydroxybutylvinyl ether, butanediol-1,4-divinyl ether, cyclohexylvinyl ether, hexanedioldivinyl ether, and the like, as well as compounds having three vinyl groups such triethyleneglycol divinyl ether, diethyleneglycol monovinyl ether, and the like, as well as compounds having 4 or more vinyl groups such as 1,4-cyclohexanoldimethanoldivinyl ether, propenyl ether of propylene carbonate, 1,1,1-tris(vinyloxymethyl)ethane, cyclohexanedimethanolmonovinyl ether, and the like.

Suitably, to provide acetal photoacid-labile groups, such vinyl ether compounds may be grafted onto a hydroxy group (e.g. a phenolic group or alcohol group such as C$_{1-12}$hydroxyalkyl) under acidic conditions preferably after dissolving the hydroxy-containing compound and the vinyl ether reagent in a suitable solvent such as one or more of acetone, tetrahydrofuran, diglyme and dioxane. Suitable acid catalysts to use to provide acidic conditions include hydrochloric acid, sulfuric acid, malonic acid and/or a sulfonic acid. Preferably, the molar ratio of free hydroxyl groups to the vinyl ether compound does not exceed 1 to 1, and more preferably the hydroxyl groups are present in a molar excess (e.g. 2:1) relative to the vinyl ether compound. In particular, a preferred synthesis includes grafting vinyl ether onto a preformed Si polymer having hydroxy groups, where only a portion of the polymer hydroxy groups are blocked with photoacid-labile groups and a portion of the polymer hydroxy groups remain unblocked as aqueous, alkaline developable groups.

Preferred polymers used in resists of systems of the invention also may contain resist repeat units that can contribute to aqueous developability of a photoresist containing the polymer. For instance, suitable resin moieties that can enhance aqueous developability include hydroxy, carboxy and other polar preferably acidic groups such as sulfonic acid and the like. A generally preferred repeat unit of this type is a hydroxy-containing unit, such as an alicyclic alcohol unit.

Additionally, preferred polymers for use in resists of systems of the invention may contain units that are free of photoacid-labile and aqueous, alkaline developing groups and will be free of moieties as discussed above, i.e. photoacid-labile ester or acetal moieties, or hydroxy, carboxy or sulfonic acid moieties. Preferred repeat units of this type include phenyl or alkyl groups that are not substituted with such photoacid-labile or aqueous, alkaline developing moieties; e.g. preferred repeat units of this type are alkyl (including cycloalkyl such as norbornyl) or phenyl groups that are either unsubstituted or substituted by one or more halo, unsubstituted alkyl, non-photoacid labile alkoxy, sulfonyl acid esters, and the like. Such substituents should be substantially stable (i.e. not undergoing a deblocking reaction) under typical lithographic conditions (e.g. pre-exposure thermal treatment of up to 140° C. for 1-2 minutes; exposure; post-exposure thermal treatment of up to about 160° C. for 1-2 minutes; and/or development with an aqueous, alkaline developer solution). Preferred substituents that are non-photoacid-labile and do not substantially promote aqueous developability useful for this type of repeat unit are disclosed as inert blocking groups in U.S. Pat. Nos. 5,736,536 and 5,541,263 both to Thackeray et al. of the Shipley Company. As disclosed in those patents, suitable substituents that are substantially inert to lithographic processing and do not substantially increase aqueous, alkaline developability of a resist containing the polymer include alkoxy groups such as methoxy, ethoxy, propoxy, n-butoxy, sec-butoxy, etc.; alkyl esters represented by RCOO— where R is preferably an alkyl group having 1 to 6 carbon atoms such as methyl, ethyl, propyl, isopropyl, butyl, etc.; sulfonyl acid esters include both alkyl (e.g. C$_{1-6}$alkyl) are carbocyclic aryl esters such as methane sulfonyl, ethane sulfonyl, propane sulfonyl, benzene sulfonyl, and toluene sulfonyl esters, etc. All those groups can be grafted onto hydroxy groups as discussed above to form sulfonyl esters, e.g. by reaction of an alkylhalide such alkylchloride to form an alkoxy group, or an acid halide such as acid chloride to form an alkylester.

Specifically preferred resist polymer units for use in systems of the invention include the following groups 1 through 8; the lines from each Si atom indicate chemical bonds to further hydrogen or non-hydrogen substituents.

1. Aqueous-base Solubilizing Groups:

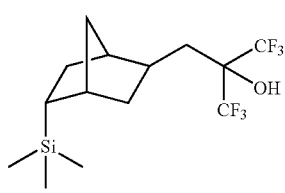

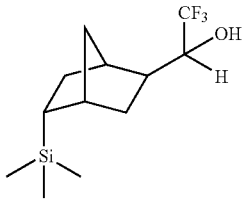

2

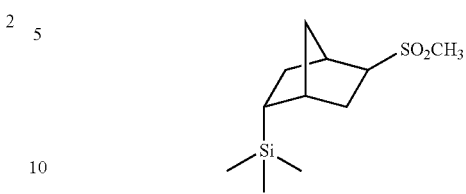

8

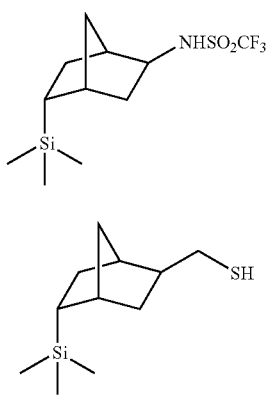

3

4

Exemplary preferred polymers comprise a structure of the following formula (I):

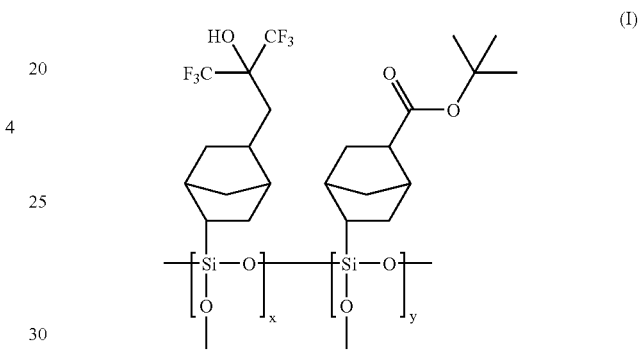

(I)

2. Photoacid-labile Groups:

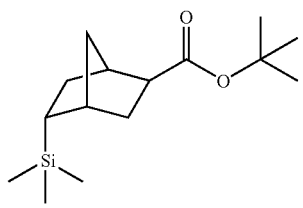

5

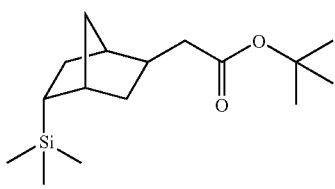

6

3. "Inert" Groups (i.e. Groups that are Free of Any Hydroxy, Carboxy or Other Aqueous Base-solublizing Groups or Any Photoacid-labile Groups):

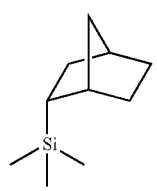

7 where in that formula (I) x is suitably from about 10 to about 90 mole percent based on total units of the polymer, and preferably x is from about 40 to about 80 mole percent based on total units of the polymer; and y is suitably from about 10 to about 80 mole percent based on total units of the polymer, and preferably y is from about 10 to about 50 mole percent, more preferably about 10 to about 30 or about 40 mole percent based on total units of the polymer. Preferably, the sum of x and y is at least about 70 or 80 mole percent based on total polymer units (i.e. the depicted units constitute at least about 70 or 80 mole percent of all polymer units), more preferably the sum of x and y is at least 90, 95 or 98 mole percent or 100 mole percent of total polymer units.

Such Si polymers containing two or three distinct repeat can be readily prepared. For instance, a hydroxy-Si reagent can be polymerized such as a hydroxylalkyl silyl reagent. A formed hydroxy-Si polymer can be functionalized to provide multiple-distinct repeat units, e.g. pendant hydroxy groups can be reacted to have both photoacid-labile groups (such as by reaction of a dicarbonate or a halocetate ester as discussed above) and non-photoacid-labile groups such as provided by reaction of a sulfonyl acid or acid chloride or the like. Preferably, those distinct groups are reacted sequentially with the pre-formed hydroxy Si polymer, although it is possible to make both additions to the pre-formed polymer in a single reaction sequence. Preferably, a portion of the hydroxy moieties are left unreacted (i.e. unsubstituted) to provide aqueous, alkaline developing enhancing OH groups.

In suitable resist copolymers, each distinct repeat units may be suitably present in a variety of relative amounts. For example, repeat units that have photoacid-labile groups suitably may be present in a polymer from about 1, 2 or 3 to about 60 or 70 mole percent, based on total repeat units of the polymer, more preferably about 5, 10 or 20 to about 30, 40 or 50 mole percent based on total units of the polymer. The repeat unit(s) that do not contain photoacid labile groups and do not substantially increase aqueous, alkaline developability (e.g. mesyl-substituted phenyl) suitably may be present in a polymer from about 1, 2 or 3 to about 50 or 60 mole percent, based on total repeat units of the polymer, more preferably about 5, 10 or 20 to about 30 or 40 or 50 mole percent based on total units of the polymer. The repeat units that increase aqueous, alkaline developability (such as alcohol units) suitably may be present in a polymer from about 10, 20 or 25 to about 30, 40 or 50 mole percent based on total units of the polymer, more preferably from about 10 to about 40 mole percent of aqueous base-solubilizing groups in the polymer based on total units of the polymer.

Preferred Si-polymers for use in a negative-acting resist composition will contain primary and secondary hydroxy moieties, suitably primary or second alcohol groups that may be present as hydroxy$C_{1-20}$alkyl groups. Such primary and secondary hydroxy can be effective sites or moieties for crosslinking.

Preferred polymers for use in resists of systems of the invention may be prepared as generally exemplified in the examples which follow.

Thus, for instance, Example 4 below exemplifies preparation of a substituted sulfonamide silyl reagent (trihalide silyl reagent) through reaction of an unsaturated alkyl amine with a substituted sulfonyl chloride to form an unsaturated substituted sulfonamide. $HSiCl_3$ is then reacted across the carbon-carbon double bond of the formed unsaturated sulfonamide preferably in the presence of a metal catalyst such as a Pt catalyst and at elevated temperature, e.g. at reflux temperature of an aromatic solvent such as toluene or xylene. The formed trihalide silyl reagent then can be reacted with other silyl reagents to form Si-polymer with substituted sulfonamide groups, as exemplified in Example 4 below and discussed above.

A thiol silyl reagent (e.g. trihalide silyl reagent) can be formed by similar procedures. For instance, an unsaturated alkyl sulfide e.g. allyl mercaptan can be reacted with $HSiCl_3$ preferably in the presence of a metal catalyst such as a Pt catalyst and at elevated temperature, e.g. at reflux temperature of an aromatic solvent such as toluene or xylene. The trichlorosilyl reagent will add $SiCl_3$ to an unsaturated carbon. The formed trihalide silyl reagent then can be reacted with other silyl reagents to form Si-polymer with thio moieties.

As indicated, photoresists used with an underlayer of the invention also may be negative-acting. Typical negative-acting compositions will crosslink in coating layer areas exposed to activating radiation. Preferred negative-acting resist compositions for use in systems of the invention will suitably comprise one or more crosslinking agents.

A variety of aromatic or aliphatic cross-linking agent that reacts with the silicon-containing polymer or oligomer may be suitably employed as a separate crosslinking component for a negative resist. A crosslinking component also may be an integral (covalently linked) portion of an Si-polymer of a resist. Such organic cross-linking agents will cure to form a polymerized network with the silicon-containing polymer or oligomer, and reduce solubility in selected solvents. Such organic cross-linking agents may be monomers or polymers.

Suitable organic cross-linking agents useful in resists of systems of the invention include, but are not limited to: amine containing compounds, epoxy containing materials, compounds containing at least two vinyl ether groups, allyl substituted aromatic compounds, and combinations thereof.

Preferred cross-linking agents include amine containing compounds and epoxy containing materials.

The amine containing compounds useful as cross-linking agents in resists of systems of the invention include, but are not limited to: a melamine monomers, melamine polymers, alkylolmethyl melamines, benzoguanamine resins, benzoguanamine-formaldehyde resins, urea-formaldehyde resins, glycoluril-formaldehyde resins, and combinations thereof. These resins may be prepared by the reaction of acrylamide or methacrylamide copolymers with formaldehyde in an alcohol-containing solution, or alternatively by the copolymerization of N-alkoxymethylacrylamide or methacrylamide with other suitable monomers. Particularly suitable amine-based crosslinkers include the melamines manufactured by Cytec of West Paterson, N.J., such as CYMEL™ 300, 301, 303, 350, 370, 380, 1116 and 1130; benzoguanamine resins such as CYMEL™ 1123 and 1125; the glycoluril resins CYMEL™ 1170, 1171 and 1172; and the urea-based resins BEETLE™ 60, 65 and 80, also available from Cytec, West Paterson, N.J. A large number of similar amine-based compounds are commercially available from various suppliers.

Melamines are the preferred amine-based cross-linkers. Particularly preferred are alkylolmethyl melamine resins. These resins are typically ethers such as trialkylolmethyl melamine and hexaalkylolmethyl melamine. The alkyl group may have from 1 to 8 or more carbon atoms but is preferably methyl. Depending upon the reaction conditions and the concentration of formaldehyde, the methyl ethers may react with each other to form more complex units.

Particularly suitable amine-based cross-linking agents include those of the following formula:

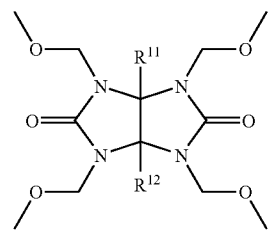

wherein $R^{11}$ and $R^{12}$ are independently selected from H, $(C_1-C_6)$alkyl and phenyl. Preferred alkyl groups for $R^{11}$ and $R^{12}$ are methyl and propyl.

Epoxy containing materials useful as cross-linkers in the resists of systems of the invention include a wide variety of organic compounds having one or more oxirane rings that are polymerizable by ring opening. Such materials, broadly called epoxides, include, but are not limited to: monomeric epoxy compounds, and polymeric epoxides that may be aliphatic, cycloaliphatic, aromatic or heterocyclic. Preferred epoxy cross-linking materials generally, on average, have at least 2 polymerizable epoxy groups per molecule. The polymeric epoxides include linear polymers having terminal epoxy groups (e.g., diglycidyl ether of a polyoxyalkylene glycol), polymers having skeletal oxirane units (e.g., polybutadiene polyepoxide), and polymers having pendant epoxy groups (e.g., glycidyl methacrylate polymer of copolymer). The epoxides may be pure compounds but are generally mixtures containing one, two or more epoxy groups per molecule.

Useful epoxy-containing materials may vary from low molecular weight monomeric materials and oligomers to relatively high molecular weight polymers and may vary greatly in the nature of their backbone and substituent groups. For example, the backbone may be of any type and substituent groups may be any group free of any substituents reactive with an oxirane ring at room temperature. Suitable substituents include, but are not limited to: halogens, ester groups, ethers, sulfonate groups, siloxane groups, nitro groups, phosphate groups, and the like.

Particularly useful epoxy containing materials for resists of systems of the invention include glycidyl ethers. Examples are the glycidyl ethers of polyhydric phenols obtained by reacting a polyhydric phenol with an excess of chlorohydrin such as epichlorohydrin (e.g., the diglycidyl ether of 2,2-bis-(2,3-epoxypropoxyphenol)propane). Such glycidyl ethers include bisphenol A epoxides, such as bisphenol A ethoxylated diepoxide. Further examples of epoxides of this type are described in U.S. Pat. No. 3,018,262, herein incorporated herein by reference to the extent this patent teaches the preparation of such epoxides.

Suitable epoxides useful in resists of systems of the invention include, but are not limited to: epichlorohydrin, glycidol, glycidylmethacrylate, the glycidyl ether of p-tertiarybutylphenol (e.g., those available under the trade name EPI-REZ 5014 from Celanese); diglycidyl ether of Bisphenol A (e.g., those available under the trade designations EPON 828, EPON 1004 and EPON 1010 from Shell Chemical Co.; and DER-331, DER-332 and DER-334 from Dow Chemical Co.), vinylcyclohexene dioxide (e.g., ERL-4206 from Union Carbide Corp.), 3,4-epoxy-6-methyl-cyclohexylmethyl-3,4-epoxy-6-methylcyclohexene carboxylate (e.g., ERL-4201 from Union Carbide Corp.), bis(3,4-epoxy-6-methylcyclohexylmethyl) adipate (e.g., ERL-4289 from Union Carbide Corp.), bis(2,3-epoxycyclopentyl) ether (e.g., ERL-0400 from Union Carbide Corp.), aliphatic epoxy modified with polypropylene glycol (e.g., ERL-4050 and ERL-4269 from Union Carbide Corp.), dipentene dioxide (e.g., ERL-4269 from Union Carbide Corp.), flame retardant epoxy resins (e.g., DER-580, a brominated bisphenol type epoxy resin available from Dow Chemical Co.), 1,4-butanediol diglycidyl ether of phenolformaldehyde novolak (e.g., DEN-431 and DEN-438 from Dow Chemical Co.), and resorcinol diglycidyl ether (e.g., KOPOXITE from Koppers Company, Inc.).

Compounds containing at least two vinyl ether groups include, but are not limited to divinyl ethers of aliphatic, cycloaliphatic, aromatic or araliphatic diols. Examples of such materials include divinyl ethers of aliphatic diols having from 1 to 12 carbon atoms, polyethylene glycols, propylene glycols, polybutylene glycols, dimethylcyclohexanes, and the like. Particularly useful compounds having at least two vinyl ether groups include divinyl ethers of ethylene glycol, trimethylene-1,3-diol, diethylene glycol, triethylene glycol, dipropylene glycol, tripropylene glycol, resorcinol, Bisphenol A, and the like.

Suitable allyl substituted aromatic compounds useful as cross-linkers in the present invention are those containing one or more allyl substituents, that is, the aromatic compound is substituted at one or more ring positions by the allylic carbon of an alkylene group). Suitable allyl aromatics include allyl phenyl compounds, such as an allyl phenol. An allyl phenol crosslinker can be a monomer or polymer that contains one or more phenol units where the phenol units are substituted at one or more ring positions by an allylic carbon of an alkylene group. Typically the alkylene substituent(s) is propenyl, i.e., the phenol has one or more propenyl substituents. Preferred allyl phenols include a polycondensate of phenol and hydroxybenzaldehyde and an allylhalide such as allylchloride. A number of suitable allyl phenols are commercially available, for example the allyl phenol sold under the trade name THERMAX SH-150AR by Kennedy and Klim, Inc. (Little Silver, N.J.). Allyl phenyl compounds including allyl phenols are also described in U.S. Pat. No. 4,987,264, herein incorporated by reference to the extent this patent teaches the preparation of such compounds.

Particularly suitable organic cross-linking agents include those containing one or more methoxymethyl groups, such as methoxymethyl-substituted melamines and methoxymethyl-substituted glycourils such as those of formula IV, above. Hexamethoxymethylmelamine is a preferred methoxymethyl-substituted melamine. It is further preferred that one or more of the hydrogens of the organic cross-linking agent, and more preferably one or more of the methyl hydrogens in the methoxymethyl substituent, is substituted with a halogen, preferably fluorine. Thus, preferred cross-linkers include those containing one or more methoxyfluoromethyl and/or methoxydifluoromethyl substituents. Exemplary preferred fluorinated cross-linking agents include methoxyfluoromethyl- and methoxydifluoromethyl-substituted melamines and glycourils, such as hexamethoxyfluoromethylmelamine and hexamethoxydifluoromethylmelamine. Also suitable are fluorinated epoxy cross-linking agents. For certain applications, it is preferred that the cross-linking agent is fluorinated.

The compositions of the present invention may suitably comprise only a single type of organic cross-linker, e.g., only an amine containing cross-linker, or may contain two or more different cross-linkers. When a combination of organic cross-linkers is used in a resist, it is preferred that the combination include an amine containing compound and an epoxy containing compound. The concentration of organic-cross-linking agents in the compositions of the present invention may vary within a relatively wide range. It will be appreciated by those skilled in the art that suitable organic cross-linker concentrations will vary with factors such as cross-linker reactivity and specific application of the composition. Typically, the cross-linking agent(s) is present in an amount in the range of 0.1 to 80% by weight, based on the total weight of the composition, preferably in the range of 0.5 to 50%, and more preferably in the range of 1 to 25%.

A wide variety of photoactive components may be used in resists of systems of the invention, including, but not limited to, photoacid generators and photobase generators. Photoacid generators are preferred. It will be appreciated by those skilled in that art that more than one photoactive component may be used advantageously in the photoimageable compositions of the present invention.

Photobase generators useful in the present invention are any compounds which liberate base upon exposure to radiation, such as sub-300 nm radiation, particularly 248 nm radiation. Suitable photobase generators include, but are not limited to: benzyl carbamates, benzoin carbamates, O-carbamoylhydroxyamines, O-carbamoyloximes, aromatic sulfonamides, alpha-lactams, N-(2-allylethenyl)amides, arylazide compounds, N-arylformamides, and 4-(ortho-nitrophenyl)dihydropyridines.

The photoacid generators useful in the present invention are any compounds which liberate acid upon exposure to radiation, such as sub-300 nm radiation, particularly 248 nm radiation. Suitable photoacid generators include e.g. halogenated triazines, onium salts, sulfonated esters and halogenated sulfonyloxy dicarboximides.

Particularly useful halogenated triazines include halomethyl-s-triazines. Suitable halogenated triazines include for example, 2-(1-(3,4-benzodioxolyl))-4,6-bis(trichloromethyl)-1,2,5-triazine, 2-(1-(2,3-benzodioxolyl))-4,6-bis(trichloromethyl)-1,3,5-triazine, 2-(1-(3,4-benzodioxolyl))-4,6-bis(tribromomethyl)-1,3,5-triazine, 2-(1-(2,3-benzodioxolyl))-4,6-bis(tribromomethyl)-1,3,5-triazine, 2-(2-furfylethylidene)-4,6-bis(trichloromethyl)-1,3,5-triazine, 2-(2-(5-methylfuryl)ethylidene)-4,6-bis(trichloromethyl)-1,3,5-triazine, 2-(2-(4-methylfuryl)ethylidene)-4,6-bis(trichloromethyl)-1,3,5-triazine, 2-(2-(3-methylfuryl)ethylidene)-4,6-bis-(trichloromethyl)-1,3,5-triazine, 2-(2-(4,5-dimethylfuryl)ethylidene)-4,6-bis(trichloromethyl)-1,3,5-triazine, 2-(2-(5-methoxyfuryl)ethylidene)-4,6-bis(trichloromethyl)-1,3,5-triazine, 2-(2-(4-methoxyfuryl)ethylidene)-4,6-bis(trichloromethyl)-1,3,5-triazine, 2-(2-(3-methoxyfuryl)ethylidene)-4,6-bis(trichloromethyl)-1,3,5-triazine, 2-(2-(4,5-dimethoxy-furyl)ethylidene)-4,6-bis(trichloromethyl)-1,3,5-triazine, 2-(2-furfylethylidene)-4,6-bis(tribromomethyl)-1,3,5-triazine, 2-(2-(5-methylfuryl)ethylidene)-4,6-bis(tribromomethyl)-1,3,5-triazine, 2-(2-(4-methylfuryl)-ethylidene)-4,6-bis(tribromomethyl)-1,3,5-triazine, 2-(2-(3-methylfuryl)ethylidene)-4,6-bis(tribromomethyl)-1,3,5-triazine, 2-(2-(4,5-dimethoxyfuryl)ethylidene)-4,6-bis(tribromomethyl)-1,3,5-triazine, 2-(2-(5-methoxyfuryl)ethylidene)-4,6-bis(tribromomethyl)-1,3,5-triazine, 2-(2-(4-methoxyfuryl)ethylidene)-4,6-bis(tribromomethyl)-1,3,5-triazine, 2-(2-(3-methoxyfuryl)ethylidene)-4,6-bis(tribromomethyl)-1,3,5-triazine, 2-(2-(4,5-dimethoxyfuryl)ethylidene)-4,6-bis(tribromomethyl)-1,3,5-triazine, 2,4,6-tris-(trichloromethyl)-1,3,5-triazine, 2,4,6-tris-(tribromomethyl)-1,3,5-triazine, 2-phenyl-4,6-bis(trichloromethyl)-1,3,5-triazine, 2-phenyl-4,6-bis(tribromomethyl)-1,3,5-triazine, 2-(4-methoxyphenyl)-4,6-bis(trichloromethyl)-1,3,5-triazine, 2-(4-methoxyphenyl)-4,6-bis(tribromomethyl)-1,3,5-triazine, 2-(1-naphthyl)-4,6-bis(trichloromethyl)-1,3,5-triazine, 2-(1-naphthyl)-4,6-bis(tribromomethyl)-1,3,5-triazine, 2-(4-methoxy-1-naphthyl)-4,6-bis(trichloromethyl)-1,3,5-triazine, 2-(4-methoxy-1-naphthyl)-4,6-bis(tribromomethyl)-1,3,5-triazine, 2-(4-chlorophenyl)-4,6-bis(tribromomethyl)-1,3,5-triazine, 2-styryl-4,6-bis(trichloromethyl)-1,3,5-triazine, 2-styryl-4,6-bis(tribromomethyl)-1,3,5-triazine, 2-(4-methoxystyryl)-4,6-bis(trichloromethyl)-1,3,5-triazine, 2-(4-methoxystyryl)-4,6-bis(tribromomethyl)-1,3,5-triazine, 2-(3,4,5-trimethoxystyryl)-4,6-bis(trichloromethyl)-1,3,5-triazine, 2-(3,4,5-trimethoxystyryl)-4,6-bis(tribromomethyl)-1,3,5-triazine, 2-(3-chloro-1-phenyl)-4,6-bis(trichloromethyl)-1,3,5-triazine, 2-(3-chlorophenyl)-4,6-bis(tribromomethyl)-1,3,5-triazine and the like. Other triazine type photoacid generators useful in the present invention are disclosed in U.S. Pat. No. 5,366,846, herein incorporated by reference.

The s-triazine compounds are condensation reaction products of certain methyl-halomethyl-s-triazines and certain aldehydes or aldehyde derivatives. Such s-triazine compounds may be prepared according to the procedures disclosed in U.S. Pat. No. 3,954,475 and Wakabayashi et al., *Bulletin of the Chemical Society of Japan*, 42, 2924-30 (1969).

Onium salts with weakly nucleophilic anions are particularly suitable for use as photoacid generators in the present invention. Examples of such anions are the halogen complex anions of divalent to heptavalent metals or non-metals, for example, antimony, tin, iron, bismuth, aluminum, gallium, indium, titanium, zirconium, scandium, chromium, hafnium, copper, boron, phosphorus and arsenic. Examples of suitable onium salts include, but are not limited to: diaryl-diazonium salts and onium salts of group VA and B, IIA and B and I of the Periodic Table, for example, halonium salts, quaternary ammonium, phosphonium and arsonium salts, aromatic sulfonium salts and sulfoxonium salts or selenium salts. Examples of suitable onium are disclosed in U.S. Pat. Nos. 4,442,197; 4,603,101; and 4,624,912, all incorporated herein by reference. Sulfonium salts such as triphenylsulfonium hexafluorophosphate are preferred.

The sulfonated esters useful as photoacid generators in the present invention include sulfonyloxy ketones. Suitable sulfonated esters include, but are not limited to: benzoin tosylate, t-butylphenyl alpha-(p-toluenesulfonyloxy)-acetate, and t-butyl alpha-(p-toluenesulfonyloxy)-acetate. Such sulfonated esters are disclosed in the *Journal of Photopolymer Science and Technology*, vol. 4, No. 3,337-340 (1991), incorporated herein by reference.

Suitable halogenated sulfonyloxy dicarboximides useful as photoacid generators in the present invention include, but are not limited to: 1(((trifluoromethyl)sulfonyl)oxy)-1H-pyrrole-2,5-dione; N-((perfluorooctanesulfonyl)oxy)-5-norbornene-2,3-dicarboximide; N-((trifluoromethylsulfonyl)oxy)-5-norbornene-2,3-dicarboximide; 1-(((trifluoromethyl)sulfonyl)oxy)-2,5-pyrrolidinedione; 3a,4,7,7a-tetrahydro-2-(((trifluoromethyl)sulfonyl)oxy)-4,7-methano-1H-isoindole-1,3(2H)-dione; 2-(((trifluoromethyl)sulfonyl)oxy)-1H-benz(f)isoindole-1,3(2H)-dione; 3,4-dimethyl-1-(((trifluoromethyl)sulfonyl)oxy)-1H-pyrrole-2,5-dione; 2-(((trifluoromethyl)sulfonyl)oxy)-1H-isoindole-1,3(2H)-dione; 2-(((trifluoromethyl)sulfonyl)oxy)-1H-benz(de)isoquinoline-1,3(2H)-dione; 4,5,6,7-tetrahydro-2-(((trifluoromethyl)sulfonyl)oxy)-1H-isoindole-1,3(2H)-dione; 3a,4,7,7a-tetrahydro-2-(((trifluoromethyl)sulfonyl)oxy)-4,7-epoxy-1H-isoindole-1,3(2H)-dione; 2,6-bis-(((trifluoromethyl)sulfonyl)oxy)-benzo(1,2-c:4,5-c')dipyrrole-1,3,5,7(2H,6H)-tetrone; hexahydro-2,6-bis-(((trifluoromethyl)sulfonyl)oxy)-4,9-methano-1H-pyrrolo(4,4-g)isoquinoline-1,3,5,7(2H,1,8,8-trimethyl-3-(((trifluoromethyl)sulfonyl)oxy)-3-azabicyclo(3.2.1)octane-2,4-dione; 4,7-dihydro-2-(((trifluoromethyl)sulfonyl)oxy)-4,7-epoxy-1H-isoindole-1,3(2H)-dione; 3-(1-naphthalenyl)-4-phenyl-1-(((trifluoromethyl)sulfonyl)oxy)-1H-pyrrole-2,5-dione; 3,4-diphenyl-1-(((trifluoromethyl)sulfonyl)oxy)-1H-pyrrole-2,5-dione; 5,5'-(2,2,2-trifluoro-1-(triflluoromethyl)ethylidene)bis(2-(((trifluoromethyl)sulfonyl)oxy)-1H-isoindole-1,3(2H)-dione; tetrahydro-4-(((trifluoromethyl)sulfonyl)oxy)-2,6-methano-2H-oxireno(f)isoindole-3,5(1aH,4H)-dione; 5,5'-oxybis-2-(((trifluoromethyl)sulfonyl)oxy)-1H-isoindole-1,3(2H)-dione; 4-methyl-2-(((trifluoromethyl)sulfonyl)oxy)-1H-isoindole-1,3(2H)-dione; 3,3,4,4-tetramethyl-1-(((trifluoromethyl)sulfonyl)oxy)-2,5-pyrrolidinedione and mixtures thereof. It is preferred that the halogenated sulfonyloxy dicarboximides comprise one or more of 1(((trifluoromethyl)sulfonyl)oxy)-1H-pyrrole-2,5-dione; N-((perfluorooctanesulfonyl)oxy)-5-norbornene-2,3-dicarboximide; N-((trifluoromethylsulfonyl)oxy)-5-norbornene-2,3-dicarboximide and 1-(((trifluoromethyl)sulfonyl)oxy)-2,5-pyrrolidinedione, and more preferably N-((perfluorooctanesulfonyl)oxy)-5-norbornene-2,3-dicarboximide or N-((trifluoromethylsulfonyl)oxy)-5-norbornene-2,3-dicarboximide.

In positive-acting systems of the present invention, the photoactive components are typically added to photoimageable compositions in an amount sufficient to generate a latent image in a coating layer of resist material upon exposure to activating radiation. When the photoactive component is a photoacid generator, the amount is typically in the range of 0.1 to 10 percent by weight, based on the weight of the resin, and preferably 1 to 8 percent by weight.

In negative-acting systems of the present invention, the amount of photoactive component useful is any amount sufficient to catalyze cross-linking of the silicon-containing polymer or oligomer. The photoactive components are typically used in the range of 0.1 to 25% by weight, based on the weight of the composition. It is preferred that the photoactive component is present in an amount in the range of 0.1 to 15% by weight, more preferably in the range of 0.1 to 12% by weight, and still more preferably less than or equal to 5% by weight. A particularly suitable range is from 0.1 to 5% by weight.

Photoresists used in resist systems of the invention may optionally further include one or more additional components, including, but not limited to, solvents, anti-striation agents, plasticizers, surfactants, base additives, speed enhancers, fillers, dyes and the like. In positive-acting systems, a base additive is typically used to adjust the photospeed of the composition. Such optional additives will be present in relatively minor concentrations in a photoresist composition except for fillers and dyes which may be used in relatively large concentrations, e.g. in amounts of from about 5 to 30 percent by weight, based on the total weight of the composition's dry components.

Photoresists used in resist systems of the invention may be readily prepared by those skilled in the art. For example, a resist composition can be prepared by dissolving the components of the photoresist, i.e. polymer binder and photoactive component, in a suitable solvent. Such suitable solvents include, but are not limited to: ethyl lactate, ethylene glycol monomethyl ether, ethylene glycol monomethyl ether acetate, propylene glycol monomethyl ether, propylene glycol monomethyl ether acetate, 3-ethoxyethyl propionate, 2-heptanone, γ-butyrolactone, and mixtures thereof.

Typically, the solids content of the photoresist composition varies from about 5 to about 35 percent by weight, based on the total weight of the composition. The resin binder and photoactive components should be present in amounts sufficient to provide a film coating layer and formation of good quality latent and relief images.

Such photoresist compositions may be applied to a substrate by any known means, such as spinning, dipping, roller coating and the like. When the compositions are applied by spin coating, the solids content of the coating solution can be adjusted to provide a desired film thickness based upon the specific spinning equipment utilized, the viscosity of the solution, the speed of the spinner and the amount of time allowed for spinning.

As discussed, Si-containing photoresists are employed as a top layer in multilayer (bilayer) photoresist system. An underlayer composition is typically applied to or coated on a substrate using any of the above described procedures, particularly by spin-coating. The bottom layer is then suitably thermally treated, under varying conditions depending on the composition's components. More particularly, if the underlayer composition does not contain an acid or acid generator compound and/or crosslinker component, the underlayer composition coating layer is suitably thermally treated under relatively vigorous conditions e.g. at 180° C. or greater for 0.5, 1 or 2 minutes. If the underlayer does contain such curing agent(s), more mild conditions may be suitably employed such as thermal treatment at less than 180° C. e.g. at about 170° C.,m 160° C., 150° C. or 140° C. or less for 0.5, 1 or 2 minutes.

Preferred underlayer composition coatings after hardening will have a thickness of from 0.4 to 1 µm. The top resist layer of a system of the invention is suitably from 0.05 to 1 µm thick, preferably from 0.1 to 0.5 µm, and more preferably from 0.1 to 0.3 µm.

After being coated on a bottom layer, a resist composition is suitably dried by heating (baked) to remove any solvent. It is preferably dried until the coating is tack free. Thereafter, it is imaged through a mask in a conventional manner. The exposure is sufficient to effectively activate the photoactive component of the photoresist to produce a patterned image in the resist coating layer, and more specifically, the exposure energy typically ranges from about 1 to 100 mJ/cm$^2$, dependent upon the exposure tool and the components of the photoresist composition.

The photoimageable compositions of systems of the invention may be activated by a variety of exposure wavelengths, particularly sub-200 nm wavelengths such as 248, 193, 157 nm and 11-15 nm.

Following exposure, the film top layer of the composition is preferably baked at temperatures ranging from about 70° C. to 160° C. Thereafter, the top layer film is developed to form an etch pattern, such as treatment with an aqueous based developer, such as quaternary ammonium hydroxide solutions, such as tetra-alkyl ammonium hydroxide, preferably a 0.15 to 0.26 N tetramethylammonium hydroxide; various amine solutions, such as ethylamine, n-propylamine, diethylamine, triethylamine or methyl diethylamine; alcohol amines, such as diethanolamine, triethanolamine; cyclic amines, such as pyrrole, pyridine, and the like.

The pattern is next transferred to the underlayer or bottom layer by etching, such as with an oxygen reactive ion etch process. After such processing, the resists, both top and bottom layers, may be removed from the processed substrate using any stripping procedures known in the art.

Photoresist systems of the invention are useful in all applications where photoresists are typically used. For example, the compositions may be applied over silicon wafers or silicon wafers coated with silicon dioxide for the production of microprocessors and other integrated circuit components. Aluminum-aluminum oxide, gallium arsenide, ceramic, quartz, copper, glass, spin-on organic dielectrics, spin-on or chemical vapor deposited inorganic dielectrics, and the like are also suitable employed as substrates for the photoresist compsitions of the invention. Other chemical vapor deposited layers, such as cap layers, etch stops and the like, may also be used as substrates.

Alternatively, the present compositions may also be used in optoelectronics applications, such as in the manufacture of optical waveguides. By "optical waveguide" is meant any device that transmits optical radiation across a two-dimensional substrate surface. Suitable optical waveguides include, but are not limited to, splitters, couplers, spectral filters, polarizers, isolators, wavelength division multiplexing structures, and the like. Such waveguides may also contain active functionality, such as amplification and switching such as with electro-optic, thermo-optic or acousto-optic devices. To be useful as amplifiers, the present waveguides typically contain one or more dopants. Erbium is an exemplary dopant. Such dopants are well known in the art. Thus, the present waveguides suitable for use as amplifiers contain one or more dopants.

The waveguides of the present invention may be manufactured as individual waveguides or as an array of waveguides. Whether such waveguides are prepared as an array depends on the particular use and is within the ability of one skilled in the art.

In one embodiment, optical waveguides may be prepared by first disposing a layer of the present compositions on a substrate by any means including, but not limited to, screen coating (or screen printing), curtain coating, roller coating, slot coating, spin coating, flood coating, electrostatic spray, spray coating, dip coating or as a dry film. When the compositions of the present invention are spray coated, a heated spray gun may optionally be used. The viscosity of the composition may be adjusted to meet the requirements for each method of application by viscosity modifiers, thixotropic agents, fillers and the like. Any substrate suitable for supporting a waveguide may be used with the present compositions. Suitable substrates include, but are not limited to, substrates used in the manufacture of electronic devices such as printed wiring boards and integrated circuits. Particularly suitable substrates include laminate surfaces and copper surfaces of copper clad boards, printed wiring board inner layers and outer layers, wafers used in the manufacture of integrated circuits, liquid crystal display ("LCD") glass substrates and the like.

The coated substrate is typically then cured, such as by baking, to remove any solvent. Such curing may be a variety of temperatures, depending upon the particular solvent chosen. Suitable temperatures are any that are sufficient to substantially remove any solvent present. Typically, the curing may be at any temperature from room temperature (i.e., 25° C.) to 170° C. Such curing typically occurs over a period of from 5 seconds to 30 minutes. Such curing may be affected by heating the substrate in an oven or on a hot plate.

After curing, the layer of resist of a system of the invention disposed on the substrate is then imaged by exposure to actinic radiation through appropriate artwork or a mask. Following exposure, the resist composition is then cured at a temperature of from 40° to 170° C. followed by development.

Following development, the present waveguides may undergo a final cure step, or re-flow step. In such final cure step, the waveguides may be heated at a temperature in from about 130° to 225° C. in air or inert atmospheres such as nitrogen or argon. Such final cure step aids in removal of residual solvent, removal of hydroxyl groups from the silsesquioxane polymer such as by increasing the extent of cross-linking, alter the waveguide profile such as to reduce surface roughness, and improves the optical transmission properties of the material.

Optical waveguides typically have a core and a cladding, wherein the cladding has a lower index of refraction as compared to the core. Particularly useful waveguides have core having an index of refraction of from 1.4 to 1.55. Typically, suitable cladding has an index of refraction of from 1.3 to 1.54.

It is preferred that a cladding layer is first deposited on a substrate. If the cladding layer is photocurable or thermocurable, it may be blanket cured as a first step. The photodefinable core material is then deposited on the cladding layer, imaged and the unexposed areas optionally removed. A second cladding layer is then deposited on the imaged waveguide. The second cladding layer may be the same or different from the first cladding layer. However, the indices of refraction of the first and second cladding layers should be the same. The second cladding layer is then cured, or imaged in the case of a photocurable cladding composition, to provide a waveguide structure.

The following examples are presented to illustrate further various aspects of the present invention, but are not intended to limit the scope of the invention in any aspect. All documents mentioned herein are incorporated herein by reference.

EXAMPLE 1

Underlayer Composition of the Invention

An underlayer (bottom layer) composition of the invention is prepared by admixing the following materials in the specified amounts:

Component

Resins
  Poly(vinylphenol) having mesyl substitution
  Terpolymer containing polymerized units of methylmethylacrylate/anthracene acrylate/ethylhydroxyacrylate Crosslinkers
  3-methyl-6-propyl-tetramethoxy glycoluril (in an amount of 4.5 weight % of resin component)
  hexamethoxymethyl melamine (tradename Cymel) (in an amount of 5 weight % of resin component)

Acid Generator
  Dodecylbenzene sulfonic acid (tradename Nacure 5225) (in an amount of 0.5 weight % of resin component)

Surfactant
  Siloxane surfactant (in an amount of 0.3 weight % of resin component)

Solvent
  90:10 v:v blend of propylene glycol monomethyl ether: ethyl lactate to provide 90 weight % fluid formulation)

EXAMPLE 2

Polymer Synthesis

The following polymer was prepared as shown in the following Scheme.

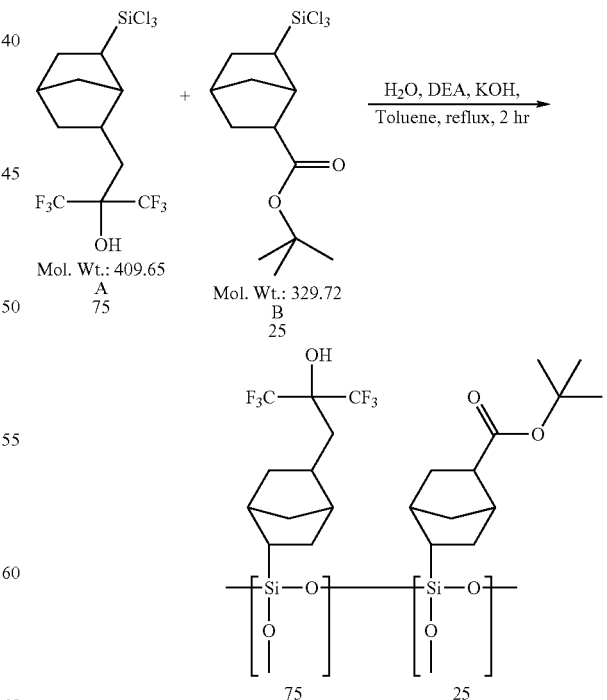

A reaction vessel was charged as follows:

| Monomer A: | 15.36 g (0.0375 mol) |
|---|---|
| Monomer B: | 4.11 g (0.0125 mol) |
| Toluene: | 40 g (46 ml) |
| DI Water: | 16.8 g |
| Diethylamine: | 10.97 g (15.5 ml) |
| KOH: | 0.21 g |

More specifically, to a 250 ml 3 necked round-bottom flask fitted with a thermometer and an addition funnel, gas inlet was added the solution of DEA (11 g), DI water (16.8 g) and toluene (10 ml). The flask temperature was between 0 to −5° C. To this chilled solution was added a mixture of the monomers (A and B as specified immediately above) and toluene (40 g) drop wise over a period of 55 min. (Note: at 0° C., there were two phases: a milky white bottom layer and a clear toluene top layer). After the addition was complete the whole mixture was allowed to come to RT and stirred for additional 1.5 hr. The two layers were separated by addition of extra water to dissolve the quaternary ammonium salt (observation: apart from the two layers, an oily white material was found in the flask which was not soluble in water as well as in toluene at room temperature. However the oily materials dissolved completely in toluene when it was heated to 50° C.) The toluene layer was washed with DI water (3×1500 ml). The pH was still around 9. It was further washed with 10% acetic acid (1×50 ml) and further washed with DI water to bring the pH to 7.

The toluene layer from above work-up was added into a 250 ml 3 necked RB flask (total solution was ~200 ml) fitted with a thermometer, Dean-Stark trap and a condenser. To the total solution was added 0.21 g of KOH dissolved in 1 ml DI water followed by 1.0 ml of DI water rinse. The mixture was heated to reflux to azeotrope water that was added to the reaction and formed during condensation. The reflux was continued for 2 hr (Note: during reflux, removed toluene (10 mL )/water (3 mL) mixture from the Dean Stark condenser). After 2 hr reflux, the solution was brought into RT and washed with 20% acetic acid (2×50 ml) further with DI water until the pH=7. The toluene solution was washed with ion-exchange resin (IRN-150) for 2 hr. Filtered the resins and toluene was removed and the polymer was dried at 50° C. overnight. The final polymer was analyzed by various techniques such as: $^1H$, $^{13}C$ and $^{29}Si$ NMR, GPC-PDA, DSC, TGA, Base content, FT-IR, MALDI-TOF.

The number of OH (silanol) group per silicon atom was calculated by using $^{29}Si$ NMR and was found to be found to be 0.2.

EXAMPLE 3

Preparation of Polymer B

Experimental procedure for the preparation of soluble polysilsesquioxane using Template method) is as follows (Scheme I):

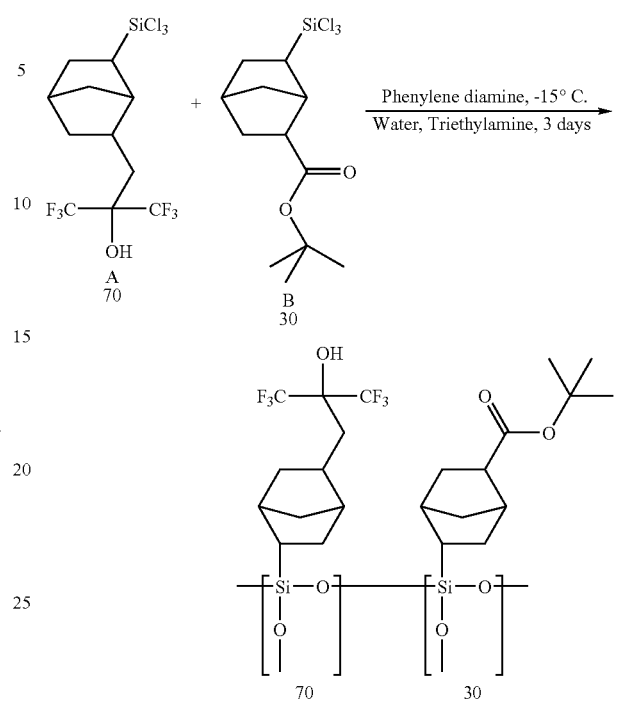

A reaction vessel was charged as follows:

| Monomer A: | 10.4 g (0.036 mol) |
|---|---|
| Monomer B: | 34.0 g (0.084 mol) |
| Phenylenediamine: | 6.9 g |
| Triethylamine: | 36 mL |
| Tetrahydrofuran: | 260 mL |
| Toluene: | 150 mL |
| DI Water: | 4.3 mL |

A solution of 6.9 g of 1,4-phenylenediamine, 12 ml of triethylamine and 160 ml of THF was added drop wise to a three necked flask containing 10.4 g of monomer A and 34.0 g of monomer B in 150 ml of toluene at −15° C. This solution was stirred for 30 min at low temperature (−15° C.) after which 4.3 ml of water and 24 ml of triethylamine and 100 ml of THF were added drop wise to the flask at −5° C. This mixture was stirred at this temperature for additional 3 h then washed with water until neutral and dried with anhydrous sodium sulfate overnight. The final solution from the above reaction was stirred in the presence of molecular sieves (4 A) and a 1 ml of triethylamine at 50° C. for 72 h. After 72 h, the polymer solution was washed with water until neutral and the solvent was distilled off. The solid polymer was dissolved in minimum amount of THF and precipitated in water (twice) and dried in vacuum at 50° C. for 24 h. The final polymer was analyzed by various techniques such as: $^1H$, $^{13}C$ and $^{29}Si$ NMR, GPC-PDA, DSC, TGA, Base content, FT-IR, MALDI-TOF.

The number of OH (silanol) group per silicon atom was calculated by using $^{29}Si$ NMR and was found to be found to be 0.8.

EXAMPLE 4

Sulfonamide Based Copolymers for 193 nm Bilayer Appication

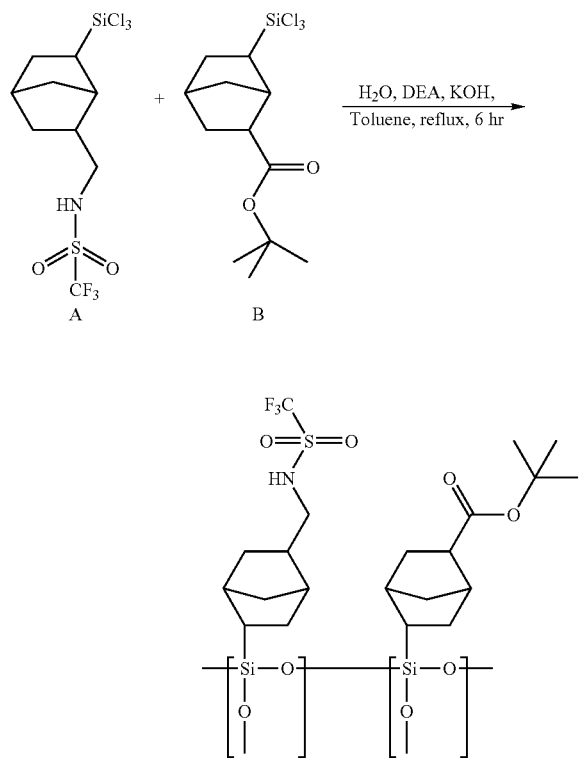

Synthesis of Monomer A:

All reaction glassware was dried in the oven overnight at 100° C. The glassware was set up and cooled under a stream of nitrogen. The reaction was carried out under a blanket of nitrogen.

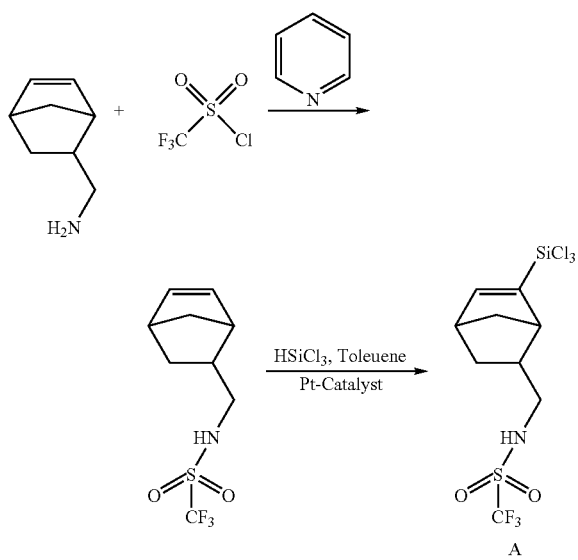

Into a dry 250 ml 3 necked flask quipped with a magnetic stirrer, condenser and an addition funnel was added 80 ml dry tetrahydrofuran, 9.7 g of pyridine and 12.3 g of Norbornene amine. The reaction mixture was cooled to 0° C. and 16.9 g of trifluoromethanesulfonylchloride was added to this mixture and stirred for 4 h. After stirring for 4 h, the pyridinium salt was filtered off and the THF was evaporated to dryness. The resulting solid was dissolved in diethylether and washed with 3.5% HCl followed by DI water till the pH 7. The ether was dried over sodium sulphate and evaporated the solvent to get an oily product. The product was analyzed by 1H, 13C and 19F NMR and it was further hydrosilylated by the following procedure:

A 100 ml 2 necked round bottomed flask quipped with refluxing condenser and an addition funnel flushed with nitrogen for 10 min and charged 200 mg of platinum-divinyltetramethyldisiloxane complex and 25 ml of toluene. The mixture was stirred at room temperature. 10.0 g of the above mixture was added (all at once) to this clear solution followed by the drop wise addition of 20 g of trichlorosilane (total addition time ~10 min) at room temperature. The whole mixture was stirred at 50° C. for 48 h, after which the solvent and the unreacted starting materials were distilled off. The crude product was subjected to $^1$H & $^{13}$C NMR (yield>95%).

Polycondensation Reaction:

To a 250 ml 3 necked Rb flask fitted with a thermometer and an addition funnel, gas inlet was added the solution of DEA (11 g), DI water (16.8 g) and toluene (10 ml). The flask temperature was between 0 to −5° C. To this chill solution was added a mixture of the monomers (A and B) and toluene (40 g) drop wise over a period of 55 min. (Note: at 0° C., there were two phases: a milky white bottom layer and a clear toluene top layer). After the addition was complete the whole mixture was allowed to come to RT and stirred for additional 1.5 hr. The two layers were separated by addition of extra water to dissolve the quart. amm. Salt (Observation: apart from the two layers, an oily white material was found in the flask which was not soluble in water as well as in toluene at room temperature. However the oily materials dissolved completely in toluene when it was heated to 50° C. The toluene layer was washed with DI water (3×1500 ml). The pH was still around 9. It was further washed with 10% acetic acid (1×50 ml) and further washed with DI water to bring the pH to 7.

The toluene layer from above work-up was added into a 250 ml 3 necked RB flask (total solution was ~200 ml) fitted with a thermometer, Dean-Stark trap and a condenser. To the total solution was added 0.21 g of KOH dissolved in 1 ml DI water followed by 1.0 ml of DI water rinse. The mixture was heated to reflux to azeotrope water that was added to the reaction and formed during condensation. The reflux was continued for 2 hr (Note: during reflux, removed toluene (10 mL)/water (3 mL) mixture from the Dean Stark condenser). After 2 hr reflux, the solution was brought into RT and washed with 20% acetic acid (2×50 ml) further with DI water until the pH=7. The toluene solution was washed with ion-exchange resin (IRN-150) for 2 hr. Filtered the resins and toluene was removed and the polymer was dried at 50° C. overnight.

EXAMPLE 5

Polymer Particularly Suitable for Negative Bilayer Resist Systems

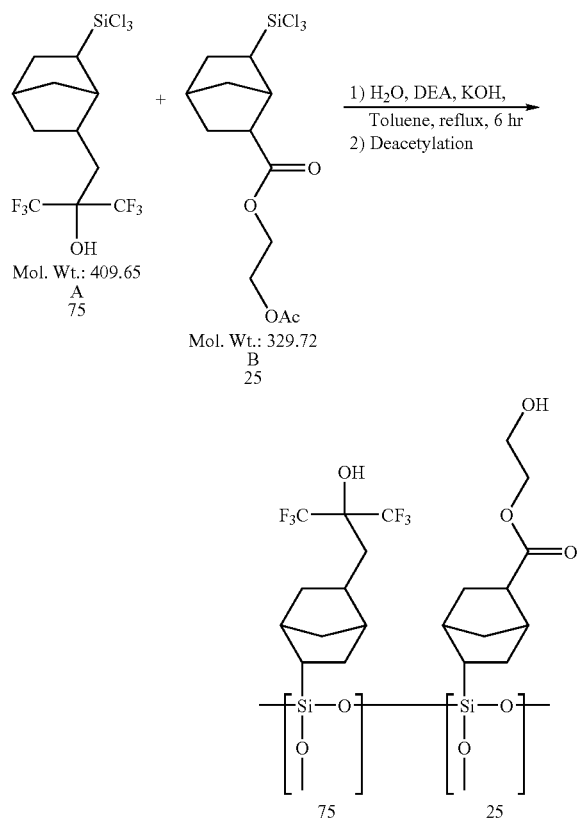

Monomer A Synthesis

| Material | Amt (g) | Amt (ml) | Moles |
|---|---|---|---|
| 3-(5-bicyclo[2.2.1]hepten-2-yl)-1,1,1-trifluoro-2-(trifluoromethyl)propan-2-ol | 50 | | 0.182 |
| Trichlorosilane | 100 | ~75 | 0.738 |
| Toluene | | 175 | |
| Pt(divinyltetramethyl) disiloxane complex | | 5 drops | |

All reaction glassware was dried in the oven overnight at 100° C. The glassware was set up and cooled under a stream of nitrogen. The reaction was carried out under a blanket of nitrogen.

To a 500 ml 3N-RB flask fitted with a gas inlet, thermometer, overhead stirrer, condenser and a glass stopper was added 50 g 3-(5-bicyclo[2.2.1]hepten-2-yl)-1,1,1-trifluoro-2-(trifluoromethyl)propan-2-ol 100 ml of to solution was added the trichlorosilane followed by the remainder of the toluene (75 ml). The mixture was heated to 50-51 C using a heating mantel. The reaction was held at 50-51 C for 36 hours. The reaction was cooled to room temperature and the excess trichlororsilane and toluene were removed under reduced pressure leaving 67 g of a crude oil. The product was purified by high vacuum distillation to give 63.3 g of product (74 C/<1 mm).

Monomer B was also prepared by the same procedure.

Polycondensation Reaction:

| Charge: | |
|---|---|
| A | 19.88 g (0.04852 mole) |
| B | 5.99 g (0.01665 mole) |
| Toluene | 60 ml |
| Acetone | 5 ml |
| DI Water | 34 g |
| Diethylamine | 22 g; KOH: 0.4 g in 3 ml water |

To a 250 ml 3 necked Rb flask fitted with a thermometer and an addition funnel, gas inlet was added the solution of DEA (22 g), DI water (34 g) and toluene (10 ml). The flask temperature was between 0 to −5° C. To this chilled solution was added a mixture of the monomers (A and B) and toluene (50 g) drop wise over a period of 55 min. (Note: at 0° C., there were two phases: a milky white bottom layer and a clear toluene top layer). After the addition was complete the whole mixture was allowed to come to RT and stirred for additional 1.5 hr. The two layers were separated by addition of extra water to dissolve the quart. amm. Salt The toluene layer was washed with DI water (3×1500 ml). The pH was still around 9. It was further washed with 10% acetic acid (1×50 ml) and further washed with DI water to bring the pH to 7.

The toluene layer from above work-up was added into a 250 ml 3 necked RB flask (total solution was ~175 ml) fitted with a thermometer, Dean-Stark trap and a condenser. To the total solution was added 0.4 g of KOH dissolved in 2 ml DI water followed by 1.0 ml of DI water rinse. The mixture was heated to reflux to azeotrope water that was added to the reaction and formed during condensation. The reflux was continued for 4 hr (Note: during reflux, removed toluene/water mixture from the Dean Stark condenser). After 4 hr reflux, the solution was brought into RT and washed with 20% acetic acid (2×50 ml) further with DI water until the pH=7. The toluene solution was washed with ion-exchange resin (IRN-150) for 2 hr. Filtered the resins and toluene was removed and the polymer was dried at 50° C. overnight. The deprotection of acetyl group from one of the monomers was carried by refluxing the copolymer in presence of dilute ammonium hydroxide solution for 24 hr. The final polymer was characterized by $^1$H, $^{13}$C & $^{29}$Si NMR, GPC-PDA, DSC, TGA, Base content, FT-IR, MALDI-TOF MS.

| NBTFE silane monomer Synthesis | | | |
|---|---|---|---|
| Material | Amt (g) | Amt (ml) | Moles |
| 1-Bicyclo[2.2.1]hept-5-en-2-yl-2,2,2-trifluoro-ethanol | 22 | | 0.114 |
| Trichlorosilane | 50 | ~36.5 | 0.368 |
| Toluene | | 75 | |
| Pt(divinyltetramethyl) disiloxane complex | 0.15 | | |

-continued

NBTFE silane monomer Synthesis

| Material | Amt (g) | Amt (ml) | Moles |
|---|---|---|---|

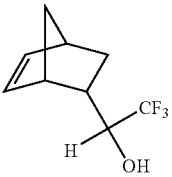

1-Bicyclo[2.2.1]hept-5-en-2-yl-2,2,2-tri-fluoro-ethanol

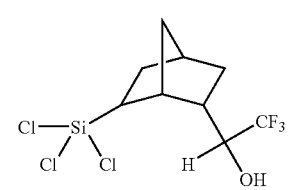

2,2,2-Trifluoro-1-(6-trichlorosilanyl-bicyclo[2.2.1]hept-2-yl)-ethanol

All reaction glassware was dried in the oven overnight at 100° C. The glassware was set up and cooled under a stream of nitrogen. The reaction was carried out under a blanket of nitrogen.

To a 300 ml 3N-RB flask fitted with a gas inlet, thermometer, overhead stirrer, condenser and a glass stopper was added 22 g 1-Bicyclo[2.2.1]hept-5-en-2-yl-2,2,2-trifluoro-ethanol, 75 ml of toluene and the catalyst. To this solution was added the trichlorosilane. The mixture was heated to 50-51° C. using a heating mantel. The reaction was held at 50-51° C. for 72 hours. The reaction was cooled to room temperature and the excess trichlororsilane and toluene were removed under reduced pressure leaving 34 g of a crude oil. NMR indicated all the staring material was consumed. Theoretical yield—37.3.

EXAMPLE 6

Photoresist Preparation and Lithographic Processing

A photoresist composition is prepared as follows. A resist solution is obtained by mixing 94.86 parts of the Si polymer prepared in Example 2, 4.50 parts of triphenylsulfonium perfluorobutanesulfonate, 0.54 parts of Troeger's base and 0.1 parts of a surfactant with 660 parts of 2-heptanone.

The underlayer composition prepared in Example 1 above is spin-coated onto an 8 inch silicon wafer and baked at 175° C. for 60 seconds to remove solvent and provide a crosslinked coating layer.

The photoresist prepared as described in this Example above is applied by spin-coating over the thus thermally treated underlayer by spin-coating. After spin-coating, the applied resist layer is baked at 90° C. for 90 seconds, and is then imaged with 193 nm radiation.

The foregoing description of the invention is merely illustrative thereof, and it is understood that variations and medications can be made as set forth in the following claims.

What is claimed is:

1. A coated substrate comprising:
  a) an organic underlayer composition coating layer on a substrate, the underlayer composition comprising (i) a first resin that comprises optionally substituted naphthyl groups, optionally substituted adamantyl groups, optionally substituted norbornyl groups, or optionally substituted isobornyl groups and (ii) a second resin that is distinct from the first resin and comprises one or more chromophore groups;
  b) over the underlayer composition coating layer, a photoresist composition coating layer for imaging at less than 200 nm, the photoresist comprising a photoactive component and an Si-containing component.

2. The coated substrate of claim 1 wherein the underlayer composition comprises an integral component that comprises both i) aromatic and/or alicyclic groups and ii) chromophore groups.

3. The coated substrate of claim 1 wherein the chromophore groups comprise anthracene groups.

4. The coated substrate of claim 1 wherein the first resin comprises optionally substituted norbornyl groups or optionally substituted isobornyl groups.

5. A method for forming a photoresist relief image comprising:
  a) applying an organic underlayer composition coating layer on a substrate, the underlayer composition comprising (i) a first resin that comprises optionally substituted naphthyl groups, optionally substituted adamantyl groups, optionally substituted norbornyl groups, or optionally substituted isobornyl groups and (ii) a second resin that is distinct from the first resin and comprises one or more chromophore groups;
  b) applying a photoresist composition coating layer over the underlayer composition, the photoresist composition comprising a photoactive component and an Si-containing component;
  c) exposing the photoresist composition coating layer to radiation having a wavelength of less than about 200 nm.

6. The method of claim 5 wherein the photoresist layer is exposed to radiation having a wavelength of less than 170 nm.

7. The method of claim 5 wherein the photoresist layer is exposed to radiation having a wavelength of about 193 nm.

8. An article of manufacture comprising a substrate having coated thereon a multilayer photoresist system, the system comprising:
  a) an organic underlayer composition coating layer on a substrate, the underlayer composition comprising (i) a first resin that comprises optionally substituted naphthyl groups, optionally substituted adamantyl groups, optionally substituted norbornyl groups, or optionally substituted isobornyl groups and (ii) a second resin that is distinct from the first resin and comprises one or more chromophore groups;
  b) over the underlayer composition coating layer, a photoresist composition coating layer for short wavelength imaging, the photoresist comprising a photoactive component and an Si-containing component.

9. The coated substrate of claim 1 wherein the underlayer composition comprises a thermal acid generator compound.

10. The coated substrate of claim 1 wherein the photoresist composition comprises a resin with Si groups.

11. The coated substrate of claim 1 wherein the photoresist composition resin comprises alicyclic groups.

12. The coated substrate of claim 1 wherein the photoresist composition resin comprises photoacid-labile groups.

13. The method of claim 5 wherein the underlayer composition comprises a thermal acid generator compound.

14. The method of claim 5 wherein the underlayer composition is crosslinked.

15. The method of claim 5 wherein the photoresist composition comprises a resin with Si groups.

16. The method of claim 5 wherein the photoresist composition resin comprises alicyclic groups.

17. The method of claim 5 wherein the photoresist composition resin comprises photoacid-labile groups.

18. A method for forming a photoresist relief image comprising:
   a) applying an organic underlayer composition coating layer on a substrate, the underlayer composition comprising (i) a first resin that comprises optionally substituted naphthyl groups, optionally substituted adamantyl groups, optionally substituted norbornyl groups, or optionally substituted isobornyl groups and (ii) a second resin that is distinct from the first resin and comprises one or more chromophore groups;
   b) applying a photoresist composition coating layer over the underlayer composition, the photoresist composition comprising a photoactive component and an Si-containing component;
   c) exposing the photoresist composition coating layer to radiation having a wavelength of less than about 170 nm.

19. The substrate of claim 1 wherein the first resin comprises optionally substituted naphthyl groups.

20. The substrate of claim 1 wherein the first resin comprises optionally substituted adamantyl groups, optionally substituted norbornyl groups, or optionally substituted isobornyl groups.

* * * * *